United States Patent [19]
Ozai et al.

[11] Patent Number: 5,303,466
[45] Date of Patent: Apr. 19, 1994

[54] METHOD OF MOUNTING SURFACE CONNECTOR

[75] Inventors: Kazuyuki Ozai; Tomonari Ohtsuki; Takakatsu Inoue, all of Tokyo, Japan

[73] Assignee: Daiichi Denshi Kogyo Kabushiki Kaisha, Japan

[21] Appl. No.: 855,243

[22] Filed: Mar. 23, 1992

[30] Foreign Application Priority Data

Mar. 25, 1991 [JP] Japan ............................ 3-082879
Feb. 14, 1992 [JP] Japan ............................ 4-059268

[51] Int. Cl.$^5$ ............................................. H05K 3/30
[52] U.S. Cl. ................................... 29/837; 29/464; 29/843; 269/903
[58] Field of Search ............. 29/843, 464, 837; 269/903

[56] References Cited

U.S. PATENT DOCUMENTS

| | | | |
|---|---|---|---|
| 4,693,528 | 9/1987 | Asick et al. ............... | 29/843 X |
| 4,741,090 | 5/1988 | Monnier ..................... | 29/464 |
| 5,155,905 | 10/1992 | Miller, Jr. ................ | 29/843 |
| 5,205,035 | 4/1993 | DiAngelo et al. ......... | 29/837 |

FOREIGN PATENT DOCUMENTS 63-124429  5/1988  Japan ............................ 29/843

Primary Examiner—Carl J. Arbes
Attorney, Agent, or Firm—Silverman, Cass & Singer, Ltd.

[57] ABSTRACT

A surface mounting method for mounting an electronic part having a great number of contacts onto a circuit board. A jig provided with dummy contacts is prepared whose size, number and arrangement are substantially the same as those of contacts of an electronic part to be mounted on a circuit board. The dummy contacts of the jig are then fitted with mating contacts which are to be fitted with the contacts of the electronic part. Thereafter, the jig provided with the dummy contacts fitted with the mating contacts is mounted onto the circuit board at a predetermined position thereon. The mating contacts are then mounted and fixed onto the circuit board. The jig is then removed from the circuit board. The contacts of the electronic part are then fitted with the mating contacts fixed to the circuit board. As an alternative, double ended socket contact members are prepared, each having socket contacts on both ends. Pin contacts of a circuit board are fitted in the socket contacts of the double ended socket contact members on their one ends and then pin contacts of an electronic part are fitted in the socket contacts of the members on their other ends.

11 Claims, 6 Drawing Sheets

FIG_2a 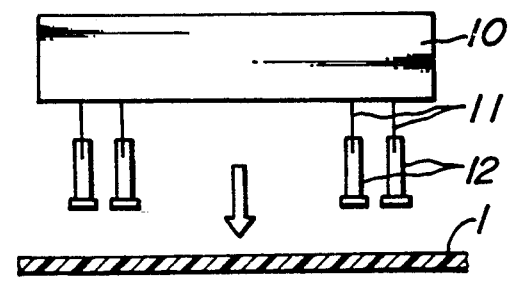
FIG_2b 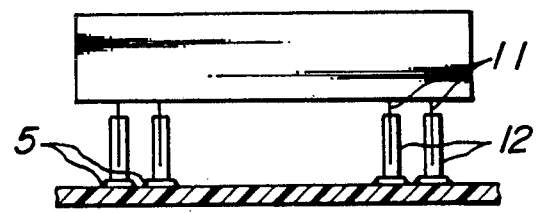
FIG_2c 
FIG_2d 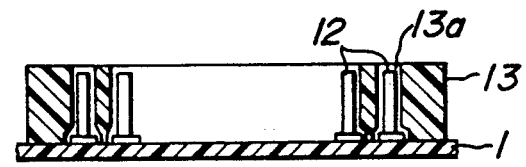
FIG_2e 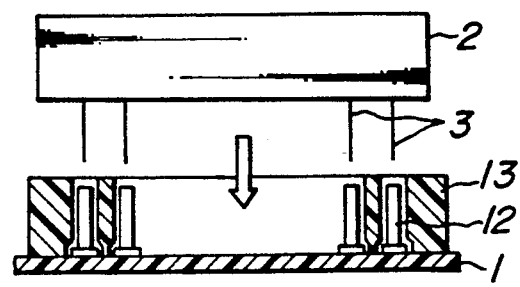

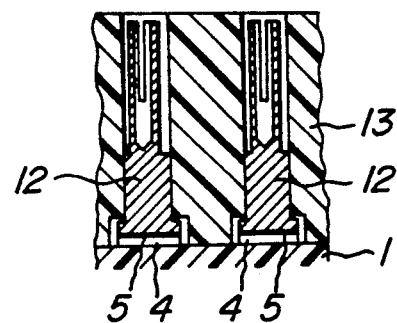
FIG_3
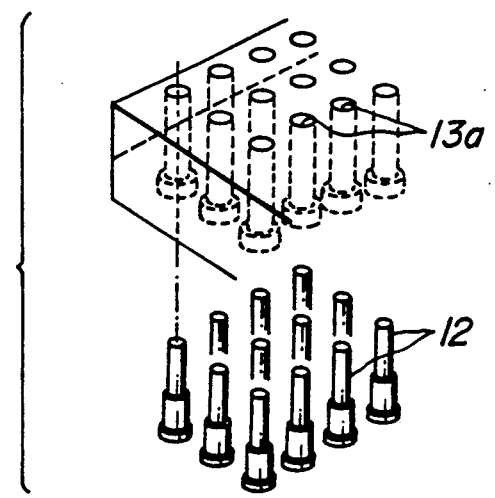
FIG_4

FIG_5
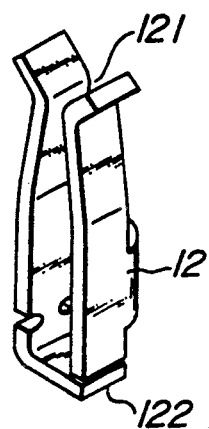
FIG_6a
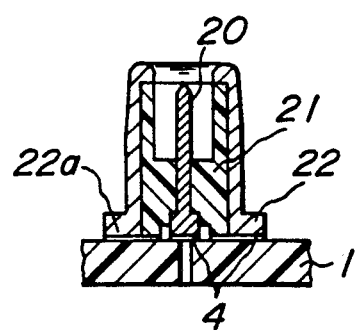
FIG_6b
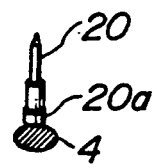

METHOD OF MOUNTING SURFACE CONNECTOR

BACKGROUND OF THE INVENTION

This invention relates to a method for mounting an electronic part on a circuit board, and more particularly to a surface mounting method for simply and easily mounting on a circuit board an electronic part whose contacts are arranged substantially vertically with very small intervals, for example, a pin grid array type (PGA type) electronic part, particularly having a great number of contacts, and further relates to a connector use in the method.

In the hitherto used method for mounting an electronic part onto a circuit board, the latter is formed with through-apertures, terminal legs of an electronic part are inserted into the through-apertures and soldered to the circuit board.

Recently, however, a method for directly soldering terminal legs of an electronic part to terminal legs of a circuit on a circuit board has been widely used without forming apertures in the circuit board for mounting electronic parts, for example, semiconductor chips, resisters, condensers, coils, socket connectors and the like onto circuit boards. This method is the so-called surface mounting method (SMT).

In the surface mounting method, in order to make it easy to inspect the connected state between the terminal legs of the circuit board and electronic part, the terminal legs of the electronic part are made in the form of a "gull wing", J-shaped lead or the like to locate the legs out of the electronic part or at least near thereto so as to effect visible inspection by observation.

On the other hand, however, with an electronic part having a great many terminals as in the PGA socket, the length of the outer periphery of the socket is short in comparison with the number of the terminals and spaces between the terminals which are very narrow. Therefore, the terminal legs are required to be elongated from the center of the socket to the outside of the outer periphery of the socket in order to carry out the surface mounting method for the electronic part having terminal legs in the form of a "gull wing" or J-shaped lead. Consequently, the arrangement of lead lines becomes unavoidably very complicated.

The PGA socket has an inherent advantage in that distribution of lead lines in high density can be avoided by uniformly arranging the terminals. However, when the terminal legs of the PGA socket extend to the outer periphery of the socket, such an advantage is no longer accomplished. Moreover, if a circuit board is slightly waved, bent or curved and a PGA socket itself is deformed, the socket terminal legs are not tolerant of irregularity of distances from the circuit board terminals, with the result that highly reliable connections between terminals can not be ensured.

In recent years, with development of the high density mounting technique for integrated circuits, the numbers of input and output terminals per unit area of circuit boards have rapidly increased. As described above, the pin grid array system (PGA system) has been employed for mounting electronic parts such as modules of central processors for large type computers with a rapid increase in the numbers of input and output terminals.

FIGS. 1a and 1b illustrate two cases of a PGA module mounted on a circuit board without extending terminal legs from the PGA module or center of its socket to its outside according to the surface mounting method in a conventional manner.

In FIG. 1a, the PGA module 2 is directly mounted on the circuit board 1. The PGA module 2 has pin contacts 3 which are fixed to "lands" 4 formed on the circuit board 1 by means of solder 5.

In FIG. 1b, onto the circuit board 1 is first mounted a connector 6 onto which the PGA module 2 is mounted. The PGA module 2 has pin contacts 3, and the circuit board 1 has "lands" 4 of a circuit pattern thereon. The connector 6 has a base 7 which is generally made of an insulating material such as ceramic or plastic material. Contact portions 8 of contacts are provided in the base 7 of the connector 6 and adapted to be fitted with the pin contacts 3 of the PGA module 2. Terminals 9 of the contacts are mounted on the base 7 of the connector 6 and fixed to the "lands" 4 of the circuit board 1 by means of solder 5.

The two methods shown in FIGS. 1a and 1b involve the following problems to be solved.

(1) With an electronic part such as a recent PGA module having a great number of pin contacts, for example, 50 to 300 contacts arranged in rows and columns, soldered conditions of the contacts near the center could not be visibly inspected although the contacts near the outer peripheries of the module and a circuit board are easily inspected. It is very difficult to perform reliable inspection on the contacts near the center even utilizing a mirror or X-ray because of hindrance of the PGA module in both the cases shown in FIGS. 1a and 1b.

(2) In the case of the FIG. 1a wherein the pin contacts 3 of the PGA module are directly soldered to the "lands" 4 of the circuit pattern on the circuit board 1, high accuracy is imposed on the lengths of the pin contacts of the PGA module. If such a requirement is not fulfilled, reliable soldering is not realized.

SUMMARY OF THE INVENTION

It is an object of the invention to provide a surface mounting method which eliminates all the disadvantages of the prior art and in which it is able to mount an electronic part, typically a PGA module having a great number of contacts onto a circuit board very simply and easily with high reliability.

In more detail, it is a first object of the invention to provide a surface mounting method which is able to mount an electronic part such as a PGA module having even several thousands of terminals onto a circuit board with a very simple lead line construction.

It is a second object of the invention to provide a surface mounting method which does not need high accuracy in size (length) of contacts different from the case of directly mounting contacts of an electronic part onto "lands" of a circuit board, that is to say, even if the circuit board and the PGA module are deformed or waved, bent or curved, any shifting of contact pins in axial directions are effectively accommodated to accomplish complete electric connections.

It is a third object of the invention to provide a surface mounting method which enables an operator to directly observe the connected state of all the mating contacts soldered on the circuit board to effect inspection with ease and which enables the operator to effect flux cleaning of the circuit board and to confirm the cleaned state thereof easily after soldering.

It is a fourth object of the invention to provide a surface mounting method, in which if there are mating contacts incompletely fixed to a circuit board, it is possible to correct the incomplete connections or to replace the wrong contacts with new ones.

It is a fifth object of the invention to provide a connector advantageously used in the surface mounting method according to the invention when both contacts of an electronic part and a circuit board are pin contacts.

These objects can be accomplished by the following subject matters of the invention.

The method according to the invention comprises steps of mounting on a circuit board mating contacts to be fitted with contacts of a part such as a PGA module which is to be mounted onto the circuit board and then fitting the contacts of the PGA module or the like with the mating contacts mounted on the circuit board.

According to this method, the mating contacts to be fitted with the contacts of the PGA module are directly mounted and fixed onto the circuit board. Therefore, all the connections of the mating contacts with the circuit board can be directly observed and if there are incompletely mounted mating contacts, they can be readily replaced with new ones.

In a second aspect, the method according to the invention comprises steps of (1) substantially vertically mounting circuit board pins corresponding to module pins of the pin grid array onto a circuit board on which the pin grid array is to be mounted, (2) fitting socket contacts of double ended socket contact members at one of their ends with the circuit board pins on the circuit board, each of the double ended socket contact members having at one end the socket contact to be fitted with one of the circuit board pins on the circuit board and at the other end a socket contact to be fitted with one of the module pins of the pin grid array, and (3) fitting the module pins of the pin grid array with the socket contacts of the double ended socket contact members at their other ends.

The order of these steps (1), (2) and (3) in the method may be suitably changed.

This method can bring about the following advantages.

(a) The connections of the lead pins mounted on the circuit board can be visibly observed for inspection.

(b) The arrangement of the PGA lead pins can be determined utilizing all the surface of the circuit board facing to the PGA at will, and sufficient spaces between the connection terminals can be used in comparison with the case using only a periphery portion.

(c) Lead lines from the terminals at the center of the connection surface of the PGA to the periphery are not needed so that a complicated lead line construction due to increase in lead lines can be avoided.

The above two methods according to the invention commonly have the following advantages.

(a) The circuit board pins mounted on the circuit board are completely exposed so that the heat produced in soldering the circuit board pins is uniformly distributed to ensure uniform soldering on all the circuit board pins.

(b) If it is required to remove the PGA from the circuit board after mounting, the PGA can be readily removed or replaced with other one.

Therefore, it is very advantageous about its preservation.

The connector according to the invention used for carrying out the method according to the second aspect of the invention comprises (1) double ended socket contact members, each having at one end a socket contact to be fitted with one of circuit board pins on a circuit board and at the other end a socket contact to be fitted with one of module pins of a pin grid array, and (2) an insulating main body formed on the side of the circuit board with circuit board pin insert apertures and contact socket receiving chambers at positions corresponding to the circuit board pins and further formed on the side of the pin grid array with the module pin insert apertures and contact socket receiving chambers at positions corresponding to the module pins.

The connector according to the invention can bring about the following significant effects.

(a) The high reliability is maintained, which has been already acknowledged on general connectors. In other words, even if the number of terminals of a PGA is several thousand, reliable electric connections are achieved.

(b) Only the insertion into the connector immediately establishes the connection of the circuit board and the PGA.

The invention will be more fully understood by referring to the following detailed specification and claims taken in connection with the appended drawings.

BRIEF DESCRIPTION OF THE DRAWINGS

FIGS. 2a, 2b, 2c, 2d and 2e illustrate successive steps of the method according to the invention;

FIG. 3 is a sectional view illustrating guard means for contacts mounted on a circuit board according to the invention;

FIG. 4 is a perspective view illustrating by way of example an arrangement of contacts mounted on a circuit board according to the invention;

FIG. 5 is a perspective view illustrating a mating contact by way of example;

FIG. 6a is a sectional view illustrating a plug type contact mounted on a circuit board by way of example;

FIG. 6b is a perspective view illustrating a pin type center conductor used in the plug type contact shown in FIG. 6a;

FIG. 7b is a perspective view illustrating a center conductor and an external conductor used in the socket type contact shown in FIG. 7a;

FIG. 10b is a side view of the double ended socket member shown in FIG. 10a; and FIG. 10c is a front view of the double ended socket member shown in FIG. 10a.

DESCRIPTION OF THE PREFERRED EMBODIMENTS

Figure 1A:
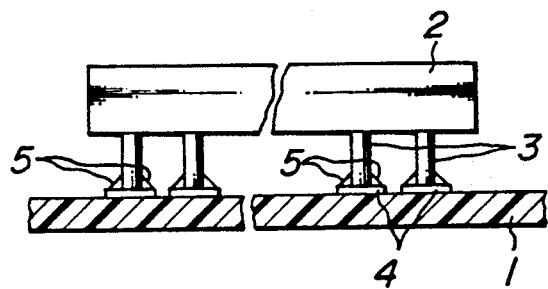
FIG. 1a illustrates an electronic part mounted on a circuit board according to the surface mounting method of the prior art.
Figure 1B:
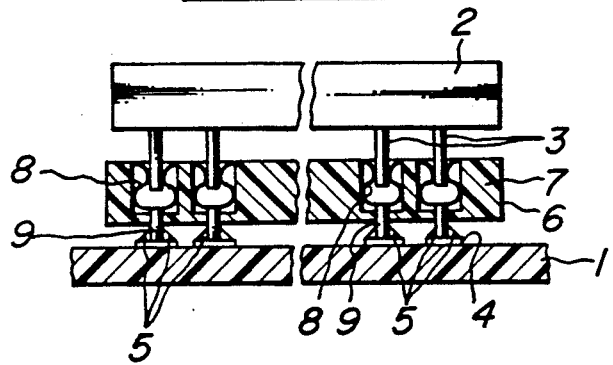
FIG. 1b illustrates an electronic part mounted on a circuit board according to the another surface mounting method of the prior art.

FIGS. 2a, 2b, 2c, 2d and 2e illustrate the successive steps for carrying out the first method according to the invention. Like components are designated by the same reference numerals as those in FIGS. 1a and 1b.

In FIG. 2a, a jig 10 is provided with dummy contacts 11 which are substantially the same in size and number as those of pin contacts 3 of a PGA module 2 to be mounted onto a circuit board 1. The dummy contacts 11 are mounted on the jig 10 substantially in the same arrangement as that of the pin contacts of the PGA module 2. FIG. 2a illustrates the step of fitting mating contacts 12 with the dummy contacts 11 of the jig 10. The mating contacts 12 are to be fitted with the pin contacts 3 of the PGA module 2.

In FIG. 2b, the mating contacts 12 have been fitted with the dummy contacts 11 of the jig 10 in the step of FIG. 2a, respectively. FIG. 2b illustrates the step of mounting the jig 10 together with the dummy contacts 11 and the mating contacts 12 on the circuit board 1 at a predetermined position thereon and fixing the mating contacts 12 to the circuit board 1 by means of solder 5 heated by heat waves or hot gas jet.

FIG. 2c illustrates the step in which after the mating contacts 12 have been mounted on the circuit board 1, the jig 10 together with the dummy contacts 11 is removed from the circuit board 1 in a manner that the fixed or soldered condition can be observed. In FIG. 2c, the jig 10 has been removed from the circuit board 1.

FIG. 2d illustrates the step in which an insulator 13 having insert apertures 13a for receiving the mating contacts 12 has been mounted on the circuit board 1 in order to protect the mating contacts 12 mounted on the circuit board 1 from being accidentally damaged.

FIG. 2e illustrates the step of inserting the pin contact 3 of the PGA module 2 into the mating contacts 12 on the circuit board 1 protected by the insulator 13 to electrically connect the circuit on the circuit board 1 with the PGA module 2, which means the completion of mounting.

In this case, although the insulator 13 in FIGS. 2d and 2e is not essential for carrying out the method according to the invention, the insulator 13 is effective in the event that there is a step or steps after the mating contacts 12 have been mounted on the circuit board 1 and before mounting the PGA module 2.

FIG. 3 is an enlarged sectional view illustrating in detail the mating contacts 12 mounted on the circuit board 1 with the insulator 13 applied thereon as shown in FIG. 2d. Each of the mating contacts 12 is fixed to a "land" 4 of the circuit pattern on the circuit board 1 by soldering 5.

FIG. 4 illustrates an arrangement of the mating contacts 12 fixed to the circuit board 1 and an arrangement of the insert apertures 13a formed in the insulator 13 for the mating contacts 12 by way of example. The number of the mating contacts 12 to be mounted on the circuit board 1 corresponds to that of the pin contacts of the PGA module to be mounted. When the number of the mating contacts 12 is more than 3,000, the contacts 12 are arranged in rows and columns like a checkerboard pattern.

While one embodiment of the invention has been explained, the configuration of the mating contacts to be mounted on the circuit board 1 may be determined to correspond to that of the contacts of an electronic part to be mounted. Moreover, if the contacts of an electronic part to be mounted are plug type, mating contacts may be socket type, while if the contacts of the electronic part are socket type, mating contacts may be plug type.

FIG. 5 shows another example of socket type contacts. The contact shown in FIG. 5 can be produced only by press-forming so that it is suitable for mass production. The socket contact 12 includes contact portions 121 and a bottom portion 122 to be soldered to a "land" of a circuit board.

FIG. 6a illustrates one example of coaxial type contacts fixed to a circuit board 1, which is a coaxial plug type contact. A pin type center conductor 20 has a configuration as shown in FIG. 6b and its bottom 20a is fixed to a "land" 4 of the circuit board 1, for example, by soldering. An insulator 21 and an external conductor 22 are coaxial to the center conductor 20 and mounted on the circuit board 1, and the external conductor 22 is soldered to a "land" 4 of the circuit board 1. The insulator 21 is not essential and can be dispensed with.

Figure 7A:
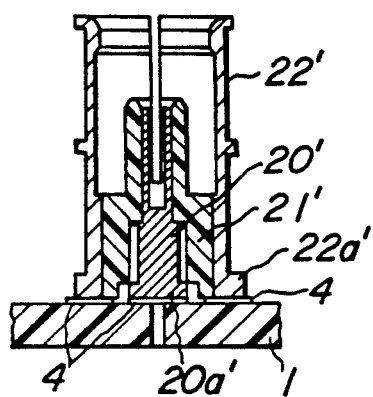
FIG. 7a is a sectional view illustrating a socket type contact mounted on a circuit board by way of example.
Figure 7B:
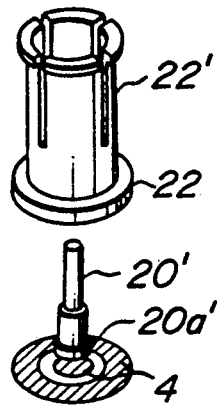

FIG. 7a illustrates another example of coaxial type contacts which is a coaxial socket type. A socket type center conductor 20' has a configuration as shown in FIG. 7b and its bottom 20a' is fixed to a circuit pattern land 4 of a circuit board 1, for example, by soldering. An insulator 21' and an external conductor 22' are coaxially mounted on the circuit board 1. The external conductor 22' has a configuration as shown in FIG. 7b and is fixed to a circuit pattern land 4 of the circuit board 1, for example, by soldering. Similar to the insulator 21 shown in FIG. 6a, the insulator 21' may be dispensed with.

Figure 8:
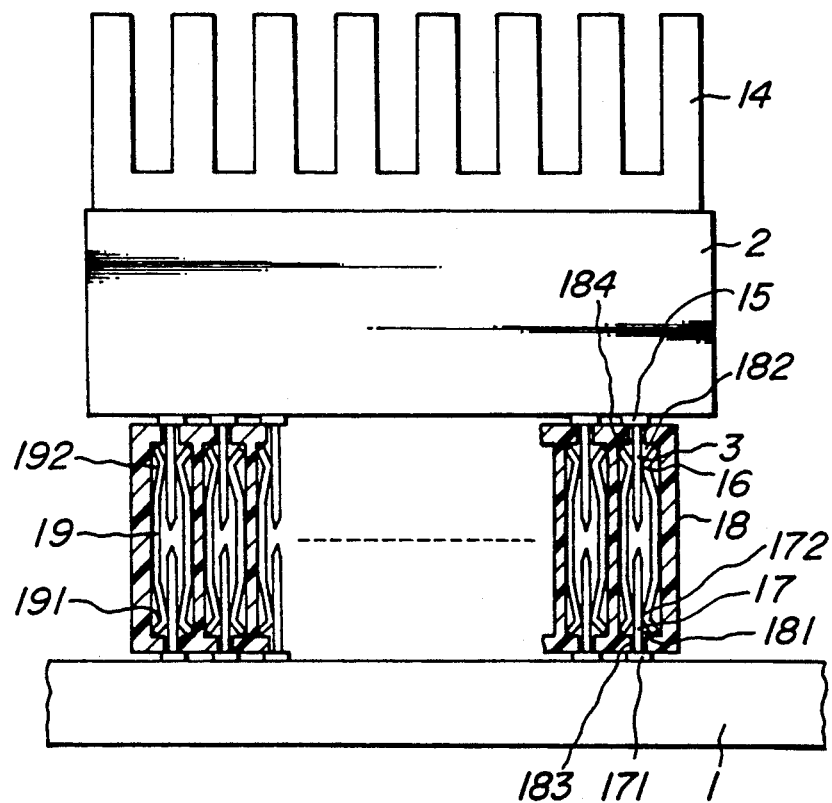
FIG. 8 is a partial sectional explanatory view of the connector according to one embodiment of the invention.

FIG. 8 illustrate by way of example a connection of a circuit board and a PGA module connected by the second method according to the invention by the use of a connector preferably used in the second method. As shown in FIG. 8, the PGA module 2 is in general provided with heat radiating means 14.

Module pins 3 are mounted on the PGA and have diameters of 0.3 mm to 0.5 mm and lengths of 2 mm to 5 mm. Each of the module pins 3 consists of a connection portion 15 to be connected to the PGA and a contact portion 16. The connection portions 15 of the module pins 3 are fixed to the PGA module by brazing in most cases. On a circuit board 1 are mounted circuit board pins 17, each including a connection portion 171 and a contact portion 172. The connection portions 171 of the circuit board pins 17 are fixed to the circuit board 1 by soldering in most cases.

A connector used for carrying out the method according to the invention has a main body 18 made of an electric insulating material such as a plastic, rubber, ceramic material or the like. The main body 18 of the connector extends within a distance 5 mm to 10 mm between the surfaces of the circuit board and the PGA. Socket contact receiving chambers 181 are formed in the main body 18 of the connector on the side of the circuit board 1 at positions corresponding to the circuit board pins 17. The socket contact receiving chambers 181 receive therein socket contacts 191 of double ended socket contact members 19 on the side of the circuit board 1. Socket contact receiving chambers 182 are formed in the main body 18 of the connector on the side of the PGA module 2 at positions corresponding to the module pins 3. The socket contact receiving chambers 182 receive therein socket contacts 192 of double ended socket contact members 19 on the side of the module pins 3.

Moreover, the surfaces of the main body 18 of the connector in opposition to the circuit board 1 and the PGA module 2 are formed with insert apertures 183 and 184 for inserting the circuit board pins 17 and the module pins 3.

Figure 9:
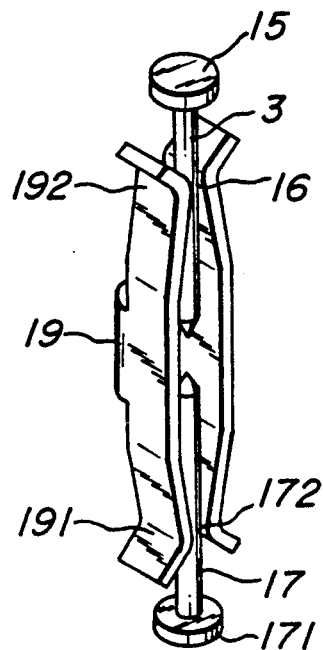
FIG. 9 is a perspective view illustrating the fitted state of a module pin and a circuit board pin used in a connector according to the invention.

FIG. 9 illustrates the double ended socket contact member 19 and the fitted relation between the socket contact member 19 and the module pin 3 and the circuit board pin 17 inserted into the socket contact member 19. In FIG. 9, the module pin 3 has the connection portion 15 to be connected to the PGA module 2 and a contact portion 16 contacting the socket contact member 19. The circuit board pin 17 has the connection portion 171 to be connected to the circuit board 1 and a contact portion 172 contacting the socket contact member 19. The double ended socket contact member 19 has the socket contact 191 on the side of the circuit board pin 17 and the socket contact 192 on the side of the PGA module pin 3.

In the invention, the module pins 3 and the circuit board pins 17 may be the same or different shapes. It is sufficient that the insert apertures 183 and 184 of the main body 18 of the connector for inserting the circuit board pins 17 and the module pins 3 are positioned to permit the circuit pins 17 and the module pins 3 to be inserted into these inset apertures 183 and 184. The positions and sizes of the circuit board pins 17 and the module pins 3 are not necessarily in the same arrangement and same positional relation. If they are in different arrangement and positional relation, the positions and sizes of the insert apertures 183 and 184 may be suitably modified correspondingly to those of the contacts 17 and 3.

Figure 10A:
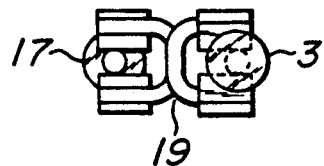
FIG. 10a is a plan view of a double ended socket member used in the connector according to the invention.
Figure 10B:
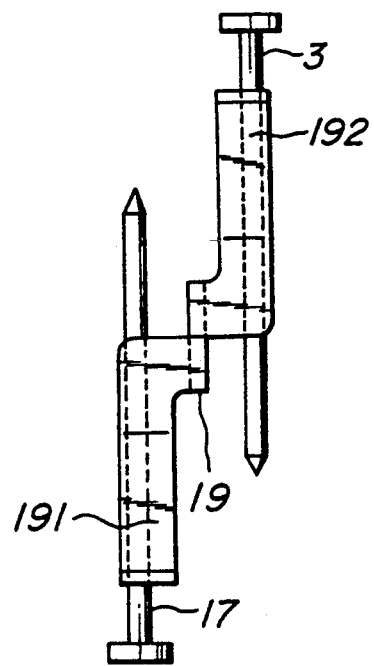
Figure 10C:
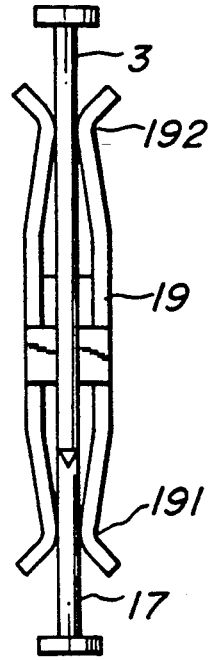

FIGS. 10a, 10b and 10c illustrate another embodiment of the double ended socket contact member 19. Like components are denoted by the same reference numerals as those in FIG. 9. As shown in FIG. 10b, socket contacts 191 and 192 of the socket contact member 19 on both sides are shifted in horizontal directions but they are connected at the center. With this arrangement, the circuit board pins 17 and the module pins 3 are not axially aligned with but shifted from each other so that the height of the main body 18 of a connector can be lowered and the maximum height of an electronic part mounted on the circuit board can be advantageously lowered.

The double ended socket contact member used in the connector according to the invention may be made of a material selected from materials used for contacts of electrical connectors generally used.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A surface mounting method comprising the steps of:
    (a) preparing a jig provided with dummy contacts whose size, number and arrangement are substantially the same as those of the contacts of an electronic part to be mounted on a circuit board,
    (b) fitting the dummy contacts of the jig with mating contacts which are to be fitted with the contacts of the electronic part,
    (c) mounting the jig provided with the dummy contacts fitted with the mating contacts onto the circuit board at a predetermined position thereon,
    (d) mounting and fixing the mating contacts onto the circuit board,
    (e) removing the jig from the circuit board,
    (f) mounting an insulator having insert apertures for receiving the mating contacts onto the circuit board, and
    (g) fitting the contacts of the electronic part with the mating contacts fixed to the circuit board.

2. The surface mounting method as set forth in claim 1, wherein the mating contacts are coaxial type contacts having pin type center conductors, respectively.

3. The surface mounting method as set forth in claim 1, wherein the mating contacts are coaxial type contacts having socket type center conductors, respectively.

4. The surface mounting method as set forth in claim 2, wherein the center conductors and external conductors of the coaxial type contacts are independently mounted on and fixed to the circuit board, respectively.

5. The surface mounting method as set forth in claim 3, wherein the center conductors and external conductors of the coaxial type contacts are independently mounted on and fixed to the circuit board, respectively.

6. A method for connecting a circuit board and a pin grid array comprising a first step of substantially vertically mounting circuit board pins corresponding to module pins of the pin grid array onto a circuit board on which the pin grid array is to be mounted, a second step of fitting socket contacts of double ended socket contact members at their one ends with the circuit board pins on the circuit board, each of the double ended socket contact members having at one end the socket contact to be fitted with one of the circuit board pins on the circuit board and at the other end a socket contact to be fitted with one of the module pins of the pin grid array, and a third step of fitting the module pins of the pin grid array with the socket contacts of the double ended socket contact members at their other ends.

7. A method for connecting a circuit board and a pin grid array as set forth in claim 6, wherein said first, third and second steps are successively carried out in this order.

8. A method for connecting a circuit board and a pin grid array as set forth in claim 6, wherein said module pins and said circuit board pins have substantially the same shape.

9. A method for connecting a circuit board and a pin grid array as set forth in claim 6, wherein said module pins and said circuit board pins have different shapes.

10. A method for connecting a circuit board and a pin grid array as set forth in claim 7, wherein said module pins and said circuit board pins have substantially the same shape.

11. A method for connecting a circuit board and a pin grid array as set forth in claim 7, wherein said module pins and said circuit board pins have different shapes.

* * * * *